US006253359B1

(12) United States Patent
Cano et al.

(10) Patent No.: US 6,253,359 B1
(45) Date of Patent: Jun. 26, 2001

(54) METHOD FOR ANALYZING CIRCUIT DELAYS CAUSED BY CAPACITIVE COUPLING IN DIGITAL CIRCUITS

(75) Inventors: Francisco A. Cano, Missouri City; Nagaraj N. Savithri, Dallas; Deepak Kapoor, Houston, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/240,993

(22) Filed: Jan. 29, 1999

Related U.S. Application Data
(60) Provisional application No. 60/072,951, filed on Jan. 29, 1998.

(51) Int. Cl.⁷ .................................................. G06F 17/50
(52) U.S. Cl. ........................................ 716/6; 716/5; 716/8
(58) Field of Search ............................................... 716/5, 6

(56) References Cited

U.S. PATENT DOCUMENTS

| 5,072,418 | 12/1991 | Boutaud et al. |
| 5,329,471 | 7/1994 | Swoboda et al. |
| 5,535,133 | 7/1996 | Petschauer et al. |
| 5,555,506 | 9/1996 | Petschauer et al. |
| 5,568,395 | 10/1996 | Huang |
| 5,596,506 | * 1/1997 | Petschauer ............................... 716/5 |

OTHER PUBLICATIONS

S/N 09/012,813 (TI docket No. TI–25311), not included.
Joardar, Kuntal, A Simple Approach to Modeling Cross–Talk in Integrated Circuits, IEEE Journal of SoldState Circuits, vol. 29, No. 10, Oct. 1994, p. 1212+.

van Genderen, A.J., et al.; Reduced RC Models for IC Interconnections With Coupling Capacitances, IEEE 3/92, p. 132–136 (0=8186–2645–392).

Sakurai, Takayasu, Closed–form Expressions for Interconnection Delay, Coupling, and Crosstalk in VLSI's, IEEE Transactions on Electron Devices, vol. 40, No. 1, Jan. 1993, p. 118–124.

* cited by examiner

Primary Examiner—Matthew Smith
Assistant Examiner—Thuan Do
(74) Attorney, Agent, or Firm—Gerald E. Laws; W. James Brady, III; Frederick J. Telecky, Jr.

(57) ABSTRACT

A method for designing and fabricating an integrated circuit is described. An increase or a decrease in a total propagation delay time 311 of a signal on a victim net 203 is accurately modeled using a modified decoupled simulation model 300. Victim net 203 is modeled as a distributed capacitor 320a–c that has a total value equal to Cgnd+2*K*Ccoup. A match propagation delay time which includes a variation in propagation delay caused by signal coupling from aggressor nets located adjacent to the victim net is determined by simulating a representative circuit using a coupled distributed load simulation model to accurately determine the match propagation delay time. K is determined using an equation in which K=1+(match delay−unmodified delay)/(2*R*Ccoup). R is the effective drive resistance of a buffer which drives the victim net and associated signal trace resistance.

19 Claims, 8 Drawing Sheets

METHOD FOR ANALYZING CIRCUIT DELAYS CAUSED BY CAPACITIVE COUPLING IN DIGITAL CIRCUITS

This application claims priority under 35 USC §119(e)(1) of Provisional application Ser. No. 60/072,951, filed Jan. 29, 1998.

FIELD OF THE INVENTION

This invention relates to methods for designing and fabricating digital circuits, and in particular to simulation of the circuit design in order to determine worst case time delays.

BACKGROUND OF THE INVENTION

Before an integrated circuit is fabricated, it is first designed by simulating the operation of the proposed circuits that are to be included within the integrated circuit. Simulation is used to verify correct functional operation of the circuit, as well as to verify correct dynamic timing operation. when two signal lines on a integrated circuit are physically adjacent there is a capacitance between the signal lines that may cause signal interference due to signal coupling.

A commonly used simulator for designing integrated circuits is SPICE, which is available from the University of California at Berkeley, via the Department of Electrical Engineering and Computer Sciences. However, a SPICE simulation of all the nets in an entire chip is far too complex to be practical.

In order to perform a SPICE simulation of a circuit, all of the nodes between every component in the circuit need to be numbered. Then those nodes, the type of components at each node, and the component magnitudes are entered into the SPICE program.

If the circuit which is being simulated is an entire integrated circuit chip, then the number of nodes and corresponding components which need to be entered into the SPICE program is overwhelming. Firstly, the number of nets may be 40,000 in a typical integrated circuit design. Secondly, for each such net, about seventy discreet components need to be entered because in the actual chip, the net components are distributed. Specifically, each signal line has capacitance which is distributed throughout the line; and each signal line also has a resistance which is distributed throughout the line. To simulate these distributed components, each signal line needs to be represented by a ladder circuit which has about two dozen nodes; with each node having a resistor to the next node, a capacitor to ground, and a capacitor to any adjacent signal line.

After all of the nodes and corresponding components for all the nets are entered into the SPICE program, the program operates to determine the voltages which occur on each node in sequential increments of time. Typically, about 1,000 increments of ten picoseconds each are needed to obtain the entire voltage waveform on a node in one net in an integrated circuit chip. To determine the voltages for just one time increment the SPICE program repetitively solves a matrix equation which is of the form [Y][V]=[I]. Here, Y is an n-x-n matrix, V is an nx1 matrix, and I is an nx1 matrix; where n is the number of nodes in the circuit. Thus, for a single victim net with twenty aggressor nets, n is (24 nodes per net)×(21 nets) or 504.

For each increment in time$_1$ the SPICE program makes about five iterations before it converges on a solution. This iterative process is repeated for each of the subsequent time increments.

Using a state of the art workstation, it takes about ten minutes to perform a SPICE simulation of a single circuit which has 500 nodes and for which a solution is sought for 1,000 time increments. Such a circuit represents a typical victim net with twenty aggressor nets. Consequently, to simulate a chip which has 40,000 nets would take about 400,000 minutes, or more than 270 days to complete!

Accordingly, a primary object of the present invention is to provide a method of designing circuit chips by which the above problems are overcome.

Other objects and advantages will be apparent to those of ordinary skill in the art having reference to the following figures and specification.

SUMMARY OF THE INVENTION

In general, and in a form of the present invention, a method is provided for designing an integrated circuit which contains a set of signal lines in close proximity, such that capacitive coupling among the signal lines is operable to affect a delay time of a signal on a victim signal line in the set of signal lines. The method starts by creating a trail layout for the set of signal lines. A coupling capacitance parameter is assigned to the victim signal line representative of a coupling capacitance between the victim signal line and a nearby aggressor signal line from the set of signal lines. In order to compensate for additional delay time of the signal on the victim signal line due to simultaneous switching of a signal on the nearby aggressor signal line, the coupling capacitance parameters is modified. The operation of the trail layout is then simulated using the modified coupling capacitance parameters to determine a total delay time for the signal on the victim signal line. The trail layout is modified if the total delay time for the signal on the victim signal line is not an allowable delay time value.

In another form of the invention, an integrated circuit is fabricated according to the modified trial layout.

In another form of the invention, a computer system is provided which as a mass storage device that holds a design program for designing an integrated circuit according to the above described method.

In another form of the invention, a first coefficient K that is related to delay sensitivity with respect to effective drive resistance of a first type driver and associated signal trace is determined. Prior to simulating the operation of the trail layout, the coupling capacitance parameter of the victim net is modified by multiplying it by the first coefficient K.

Other embodiments of the present invention will be evident from the description and drawings.

BRIEF DESCRIPTION OF THE DRAWINGS

Other features and advantages of the present invention will be come apparent by reference to the following detailed description when considered in conjunction with the accompanying drawings, in which.

Corresponding numerals and symbols in the different figures and tables refer to corresponding parts unless otherwise indicated.

DETAILED DESCRIPTION OF PREFERRED EMBODIMENTS OF THE INVENTION

Aspects of the present invention include methods and apparatus for designing an integrated circuit. In the following description, specific information is set forth to provide a thorough understanding of the present invention. Well known circuits and devices are included in block diagram form in order to not to complicate the description unnecessarily. Moreover, it will be apparent to one skilled in the art that specific details of these blocks are not required in order to practice the present invention.

Figure 1:
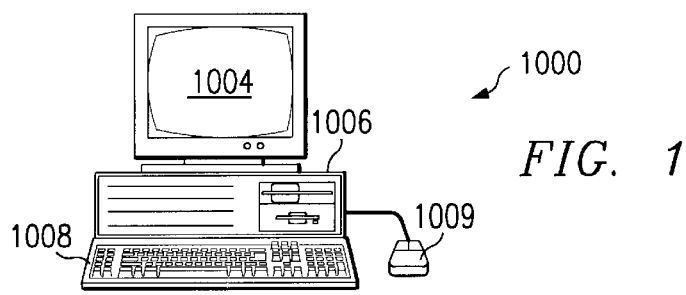
FIG. 1 is an illustration of a computer system which contains a design program for designing integrated circuits incorporating aspects of the present invention.
Figure 2:
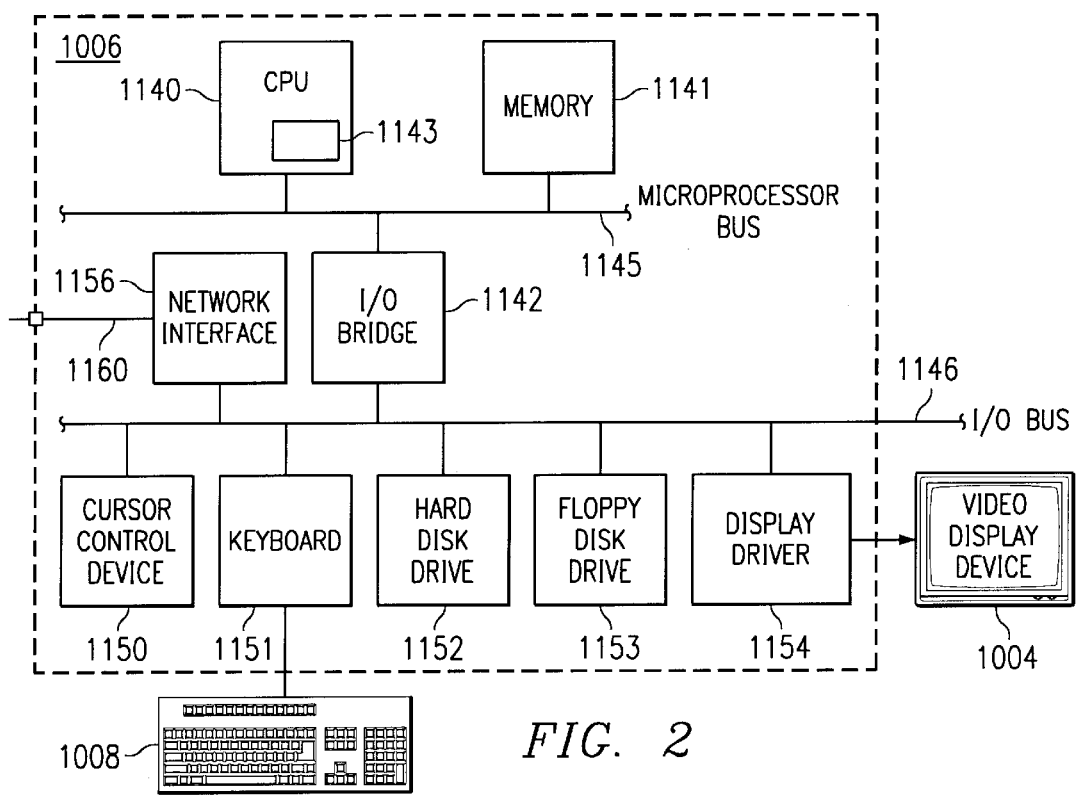
FIG. 2 is a block diagram of the computer of FIG. 1.

FIG. 1 is an illustration of a computer system 1000 which contains a design program incorporating aspects of the present invention, and FIG. 2 is a block diagram of the computer of FIG. 1. A design program which contains steps for designing an integrated circuit according to aspects of the present invention, as described in the following paragraphs, is stored on a hard drive 1152. This design program can be introduced into a computer 1000 via a diskette installed in a floppy disk drive 1153, or down loaded via network interact 1156, or by other means. The program is transferred to memory 1141 and instructions which comprise the program are executed by processor 1140. Portions of the integrated circuit design are displayed on monitor 1004. The design program includes a simulator for modeling and extracting parasitic effects and simulating the operation of the integrated circuit according to aspects of the present invention.

Figure 3:
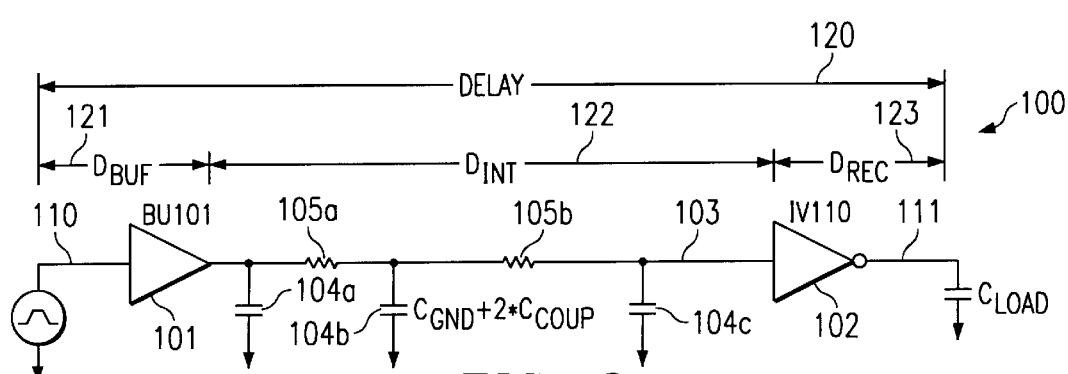
FIG. 3 is an illustration of a prior art simulation model using a decoupled and distributed load for interconnect coupling capacitance.

FIG. 3 is an illustration of a prior art simulation model 100 using a decoupled model for interconnect coupling capacitance. During the design of an integrated circuit it is often desirable to determine a propagation delay from the time an input signal changes in a particular circuit until a corresponding change in an output signal occurs from that circuit. Simulation model 100 is representative of a simple circuit that includes a buffer 101, a receiver 102, and an interconnect 103 between them. An input signal is provided to the circuit on an input signal line 110 and an output signal is produced by the circuit on signal line 111. A total propagation delay of 120 is determined by simulating the operation of the model 100. The total propagation delay of 120 is comprised of several portions, including buffer delay 121, interconnect delay 122, and receiver delay 123. Interconnect delay 122 is determined by modeling interconnect signal line as a distributed series of capacitors 104a–c and resistors 105a–b. The capacitors 104a–c have values equal to the total amount of distributed capacitance between signal line 103 and a ground plane, which is generally the substrate of the integrated circuit. This value is referred to as "Cgnd." An additional amount of capacitance is included which represents a total value of distributed coupling capacitance between signal line 102 and an adjacent signal line. This decoupled value is referred to as "Ccoup." Since a signal line can be adjacent to signal line 103 on both sides, Ccoup is typically multiplied by 2 to provide a worst case estimate. In general, capacitor 104b is assigned a value of (Cgnd+2*Ccoup)/2, while each of capacitors 104a and 104c are assigned a value of (Cgnd+2*Ccoup)/4. Resistors 105a/b are assigned values determined by the physical size and electrical properties of trace 103.

Throughout this document, the following terms are to be interpreted as follows:

coupled—Refers to two nets with the capacitance between them modeled as a capacitor connected to the two nets of value equal to the capacitance between the nets. (also known as true C);

decoupled—Refers to two nets with the capacitance between them modeled as two capacitors. Each capacitor has one terminal connected to GND and one terminal connected to each of the nets. The value of both capacitors is equal in value to the capacitance between the nets. The only time the values are different than the capacitance between the two nets is when coupling compensation is being performed. (also known as lump c)

distributed parasitics—refers to a net modeled as a network of resistors, and/or inductors with possibly capacitance at each of the nodes in the net.

lumped parasitics—Refers to a net or portion of a net where the resistance and inductance of the net are not modeled. In this case the capacitance would be lumped on a single node that would model a net or portion of a net.

net—a collection of electrically connected interconnect lines.

node—The electrical junction where one or more resistors/inductors are joined. Nodes may be added to a net when resistors/inductors are used to model the parasitics of the interconnect lines making up a net.

victim—the net that is being modeled through the proposed coupling compensation methods.

aggressor—a net that is affecting the delay of the victim net.

It has now been determined that in sub-micron digital integrated circuit signal line interconnects, coupled signals resulting from coupling capacitance between simultaneously switching signals can cause increased logic delay. Existing simulation tools for large circuit timing analysis do not compensate for this effect. A match propagation delay time which includes a variation in propagation delay caused by signal coupling from aggressor nets located adjacent to the victim net is determined by simulation of a representative circuit using a coupled simulation model with distributed load to accurately determine a match propagation delay time. According to an aspect of the present invention, a decoupled simulation model can be modified to produce results comparable to the match propagation delay time, as will now be described.

Figure 4:
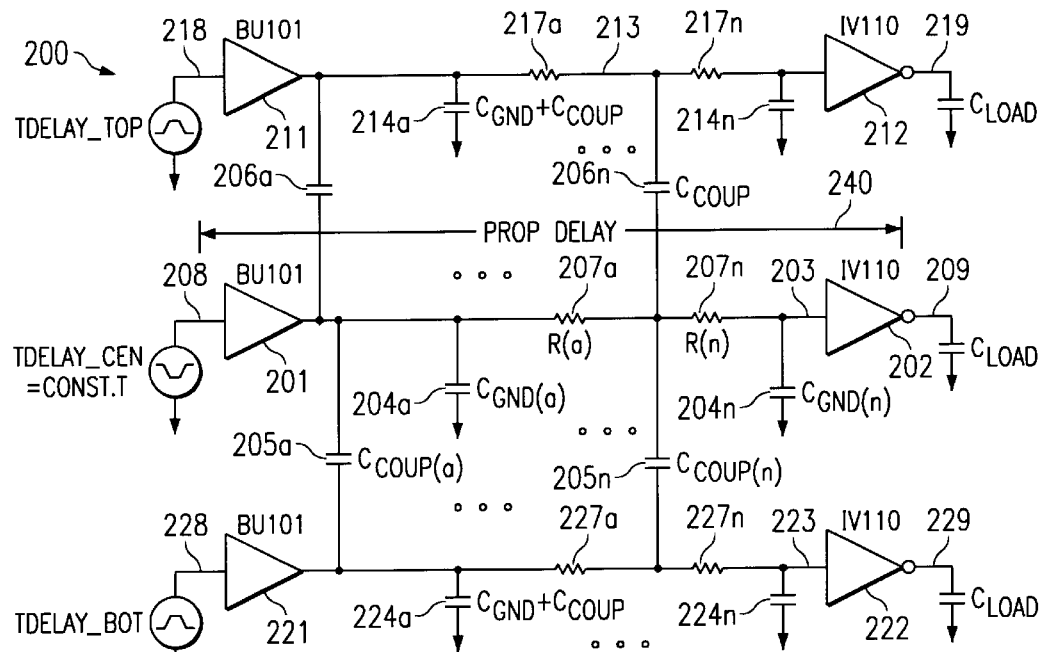
FIG. 4 is a coupled simulation model for determining propagation delay in a signal line influenced by signal transitions on adjacent signal lines, according to an aspect of the present invention

FIG. 4 is a coupled simulation model 200 for determining propagation delay in a signal line influenced by signal transitions on adjacent signal lines, according to an aspect of the present invention. Simulation model 200 is a fully distributed model so that effects of signal coupling can be correctly modeled. Signal line 203 which is referred to as a "victim net" is modeled as a set of capacitors 205a–n to ground and a set of resistors 207a–n in series. Signal line 213 and signal line 223 represent signal lines routed adjacent to victim net 203. These are referred to as "aggressor nets." Both aggressor nets are also modeled as a set of distributed capacitors and resistors. However, the values of distributed capacitors 214a–n are increased by an amount to represent a coupling capacitance between aggressor net 213 and another signal line adjacent to it. Likewise, the values of distributed capacitors 224a–n are increased by an amount to represent a coupling capacitance between aggressor net 223 and another signal line adjacent to it.

Still referring to FIG. 4, coupling capacitance between victim net 203 and aggressor net 213 is modeled as distributed capacitors 206a–n. Likewise, coupling capacitance between victim nets 203 and aggressor nets 223 is modeled as distributed capacitors 205a–n.

Still referring to FIG. 4, a series of SPICE simulations is preformed in which the time at which input signals to the aggressor nets switch on lines 218 and 228 is varied with respect to the time at which an input signal to the victim net on line 208 switches to determine a worst case propagation delay 240. Results of these simulations are plotted in FIGS. 7A, 7B, 8A, 8B, 9A, and 9B and will be discussed in detail later. It has now been determined that propagation delay of a signal on victim nets is significantly increased when signals on the aggressor nets switch in an opposite direction coincidentally with the signal on the victim nets. Unexpectedly, it has also been determined that a propagation delay of a signal on the victim nets is significantly decreased when signals on the aggressor nets switch in the same direction coincidentally with the signal on the victim net. According to an aspect of the present invention, these increases and decreases in propagation time on a victim net are important and must be included in a proper design of an integrated circuit. However, with current computer systems, it is impractical to perform such a series of SPICE simulations, or other similar types of simulators, using distributed models on every possible victim net in an integrated circuit.

Figure 5:
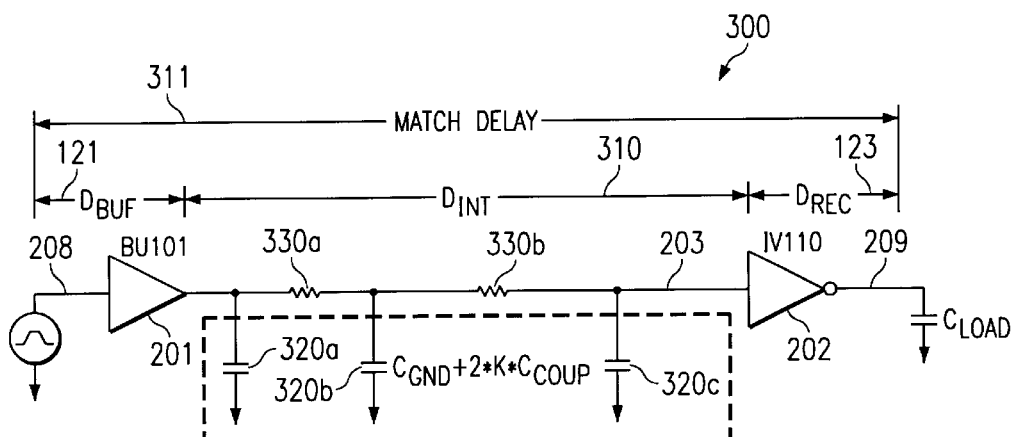
FIG. 5 is a decoupled simulation model with coupling capacitance modified according to an aspect of the present invention.

FIG. 5 is a decoupled load simulation model 300 with coupling capacitance modified according to an aspect of the present invention which advantageously provides approximately the same worst case results with a simple decoupled load simulation as the complex distributed simulation of FIG. 4. Thus, a worst case design analysis of an integrated circuit design can be advantageously performed in an expedient manner using aspects of the present invention. In simulation model 300, victim net 203 is driven by the same buffer 201 and received by the same receiver 202 as distributed simulation 200. However, signal line 203 is modeled as decoupled capacitors 320a–c and resistors 330a–b. Capacitors 320a–c together have a value equal to the total capacitance to ground Cgnd and total coupling capacitance Ccoup multiplied by two. However according to an aspect of the present invention, the coupling capacitance is also modified by a factor K to account for changes in propagation time due to signals coupled from an aggressor nets. Thus, a total worst case delay time 311 can be determined from decoupled simulation model 300 that approximately matches the worst case delay time 240 from coupled simulation model 200. In general, capacitor 320b is assigned a value of (Cgnd+2*K*Ccoup)/2, while each of capacitors 320a and 320c are assigned a value of (Cgnd+2*K*Ccoup)/4. Resistors 330a and 330b are assigned values according to the physical and electrical properties of trace 203.

A method for determining coefficient K will now be described. Since it is advantageous for propagation delay 311 to approximately match propagation delay 240, a propagation delay equation for decoupled model 300 is as follows:

match propagation delay 240=Dbuf+Drec+R*(Cgnd +2*K*Ccoup)    1)

where: R is a value for an effective driving resistance driving capacitors 206a–n and 205a–n.

Referring again to FIG. 3, an equation for unmodified propagation delay 120 is as follows:

unmodified propagation delay 120=Dbuf+Drec+R*(Cgnd+ 2*Ccoup).    2)

Since a difference in unmodified propagation delay 120 and match propagation delay 240 has been determined from the simulation described with reference to FIG. 5, equation 2 can be subtracted from equation 1 and solved for K:

K=1+(match delay 240−unmodified delay 120)/(2*R*Ccoup)    3)

Thus, according to equation 3 coefficient K can be determined if effective drive resistance R is known.

Figure 6A:
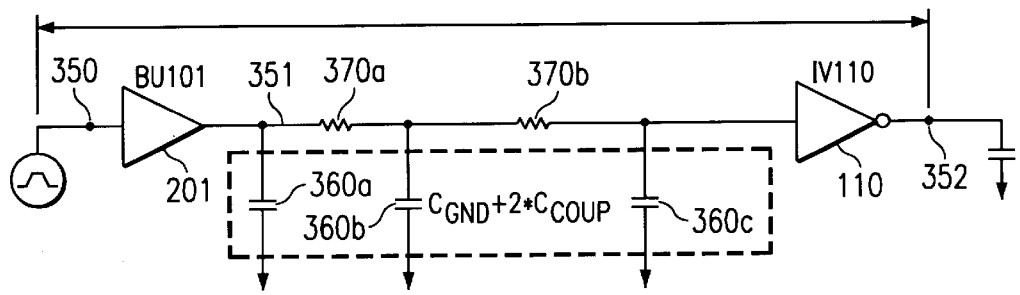
FIG. 6A is a simulation network for delay sensitivity to variations in the coupling capacitance.

FIG. 6A is a simulation network for determining effective driving resistance R of a simulated driver circuit. Buffer 201 from FIG. 4 and FIG. 5 is connected to distributed signal 351 as in FIG. 3. According to an aspect of the present invention, the value for capacitors 360a–c is modified from that in FIG. 3 to add a multiplier X for Ccoup. Capacitor 360b is assigned a value of (Cgnd+2*X*Ccoup)/2, while each of capacitors 360a and 360c are assigned a value of (Cgnd+ 2*X*Ccoup)/4. Resistors 370a and 3730b are assigned values according to the physical and electrical properties of trace 351. For this embodiment, trace 351 is modeled as a line 3000 um long, 0.7 um wide and 70 mohms/square. According to an aspect of the present invention, it has been determined that coupling coefficient K is to a first order independent of these values. The circuit is then simulated over various values for X ranging from 0.0 to 3.0. A propagation delay D1 of a signal from point 350 to point 352 is determined by simulation.

Figure 6B:
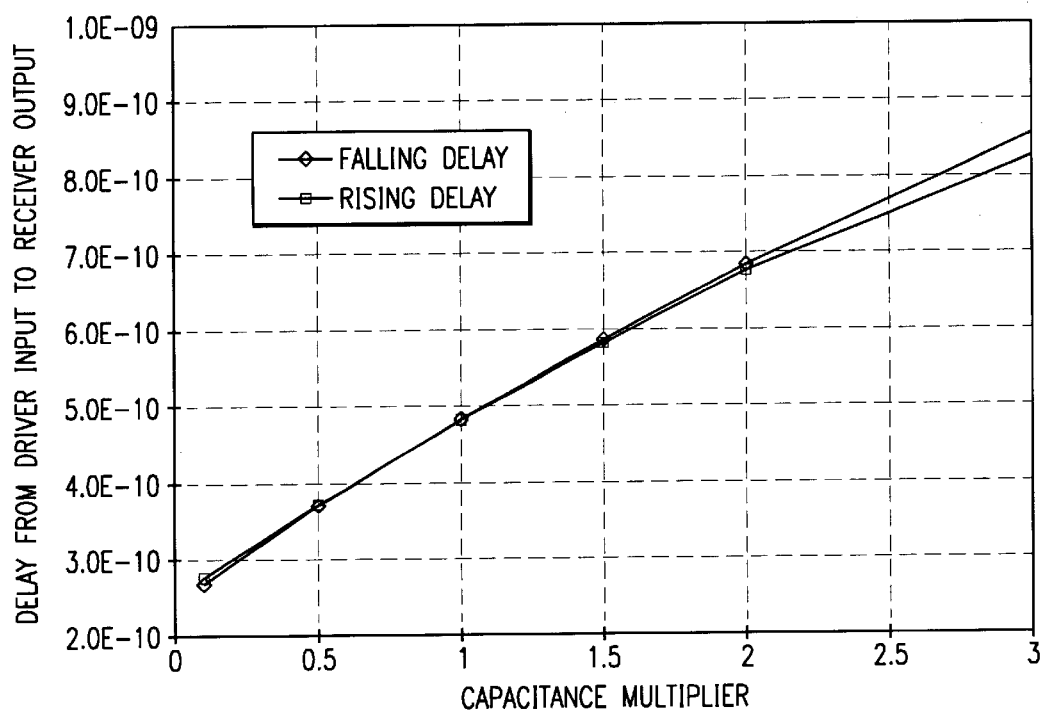
FIG. 6B is a plot of delay versus capacitance for the circuit of FIG. 6A, wherein the slope of the plot line is the effective resistance driving the coupling capacitance when the driver P:N ratio is 1.3:1.

FIG. 6B is a plot of delay verses capacitance for the circuit of FIG. 6A, wherein the slope of the plot line is effective resistance driving capacitors 360a–c. The x-axis represents capacitance in pf, the y-axis represents delay time in ns, and the slope, ns/pf, is k-ohms.

Figure 6C:
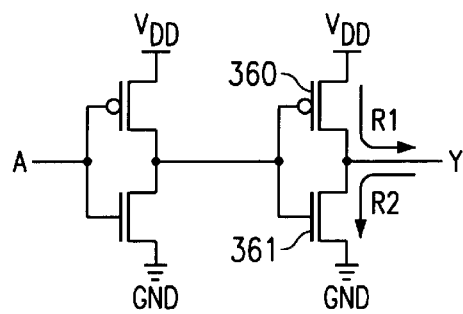
FIG. 6C is a schematic of a buffer showing a pull-up driver and a pull-down driver.
Figure 6D:
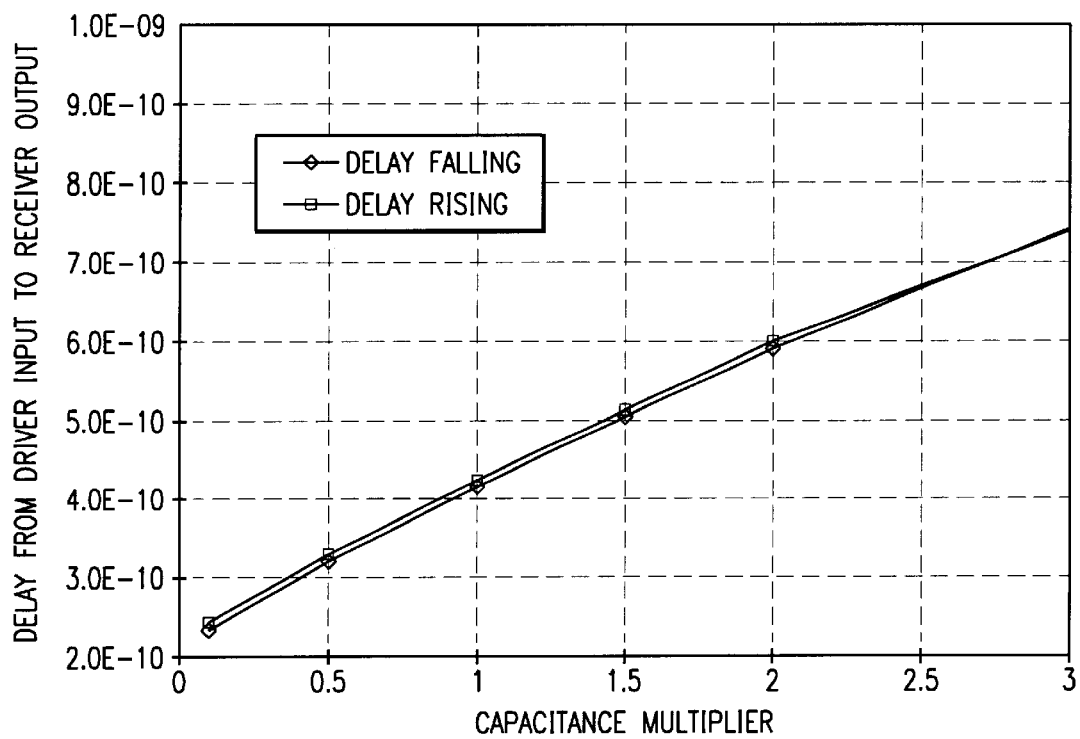
FIG. 6D is a plot of delay versus capacitance for the circuit of FIG. 6A, wherein the slope of the plot line is the effective resistance driving the coupling capacitance when the driver P:N ratio is 2.5:1.

FIG. 6C is a schematic of buffer 201 showing a pull-up driver 361 and a driver 362. The variation in propagation delay is linear with respect to load capacitance for fast input rise times at point 352, at least over a narrow range of load. However, if the load is large enough to cause saturation of the output driver the buffer 201, then non-linear operation may be observed. In either case, the effective output resistance is determined by the slope of the delay verses coupling multiplier plot in the neighborhood of the expected total load capacitance. Note that this process is performed for both a rising transition and a falling transition to determine an effective resistance R1 for the pull up driver and an effective resistance R2 for the pull down driver. Typically, R1 and R2 are different. Thus, according to an aspect of the present invention, a value or range of values for coefficient K can be determined for a given type of buffer driving a range of loads for both rising signals and falling signals.

Figure 7A:
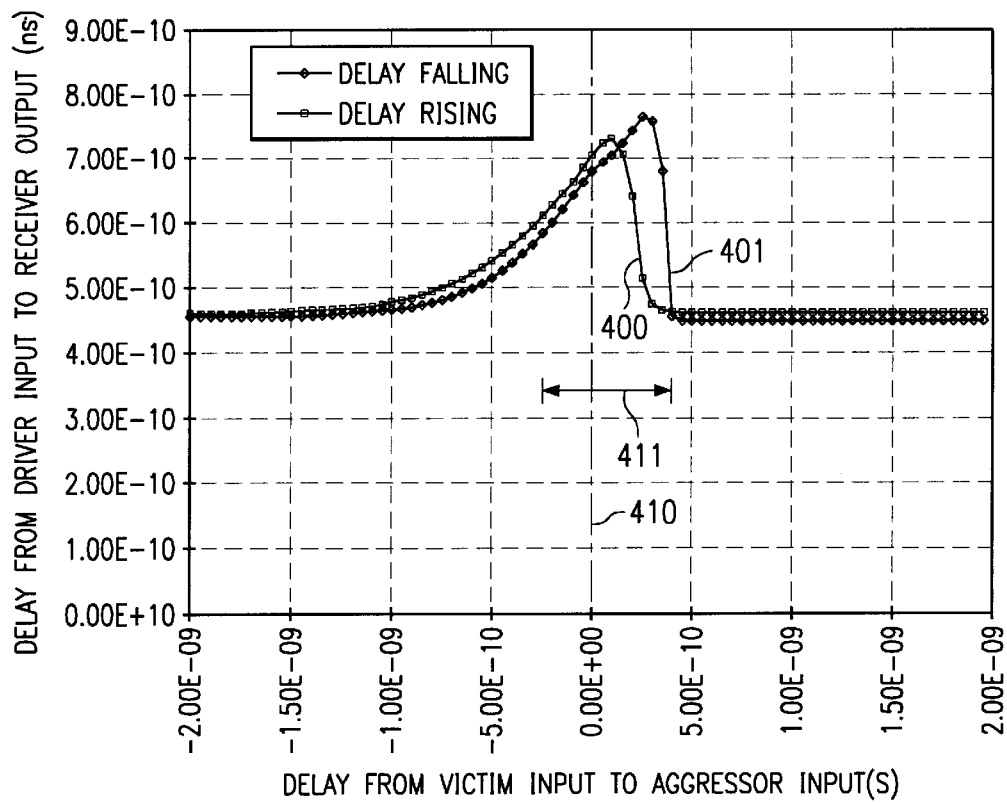
FIG. 7A is a plot of propagation delay verses relative switching time of the outside signal in the model of FIG. 4, where the P:N ratio of the buffer is 1.3:1 and aggressor signals are switching in an opposite direction from a victim signal.

FIG. 7A is a plot of propagation delay verses relative switching time of the outside signals 208 and 228 in the model of FIG. 4, where the P:N ratio of buffer 201 is 1.3:1; that is, the transistor width of the pull-up driver 360 in buffer 201 is 1.3 times wider than the pull-down driver 361. A signal on signal line 208 transitions at time 0, indicated at 410, to excite victim net 203. Signals on signal lines 218 and 228 transition simultaneously in an opposite direction from the signal on line 208 to excite aggressor nets 213 and 223 at times relative to the transition of the signal on signal line 208. A sequence of simulations are performed at different relative times to determine the propagation delay 240 of the signal on victim net 203. For this plot, a simulation was performed at time increments of 0.05 ns. Plot line 400 represents propagation delay 240 when the signal on victim nets 203 is transitioning from a low level to a high level, while plot line 401 represents propagation delay 240 when the signal on victim net 203 is transitioning from a high level to a low level.

Sill referring to FIG. 7A, it can be seen that propagation delay 240 is significantly increased for both rising transition plot 400 and falling transition plot 401. The maximum increase in propagation delay time occurs approximately when the signals on the aggressor nets transition coincidentally with the signal on the victim net; however, a significant increase in propagation delay time occurs approximately when the signals on the aggressor nets transition coincidentally with the signal on the victim net. In this embodiment, a significant increase in propagation time 240 occurs for transition times on the aggressor nets that are as much as approximately 0.25 ns before or 0.2 ns after the transition time of the signal on the victim nets, as indicated by a "window of sensitivity" time period 411. According to an aspect of the present invention, this increase in propagation delay 240 caused by signal coupling from aggressor nets is included in a worst cased timing analysis of a circuit during design of than integrated circuit, and a trial circuit design or trail layout of the circuit is modified if the increased propagation delay 240 exceeds an allowable propagation delay time value for the circuit. Window of sensitivity 411 is approximately 0.5 ns in this embodiment for a selected integrated circuit fabrication technology. Other embodiments may have a larger or smaller window of sensitivity. The window of sensitivity may be different in alternative embodiments with different electrical parameters, such as: a different signal voltage level, different geometry signal lines, faster or slower buffers, etc.

Figure 7B:
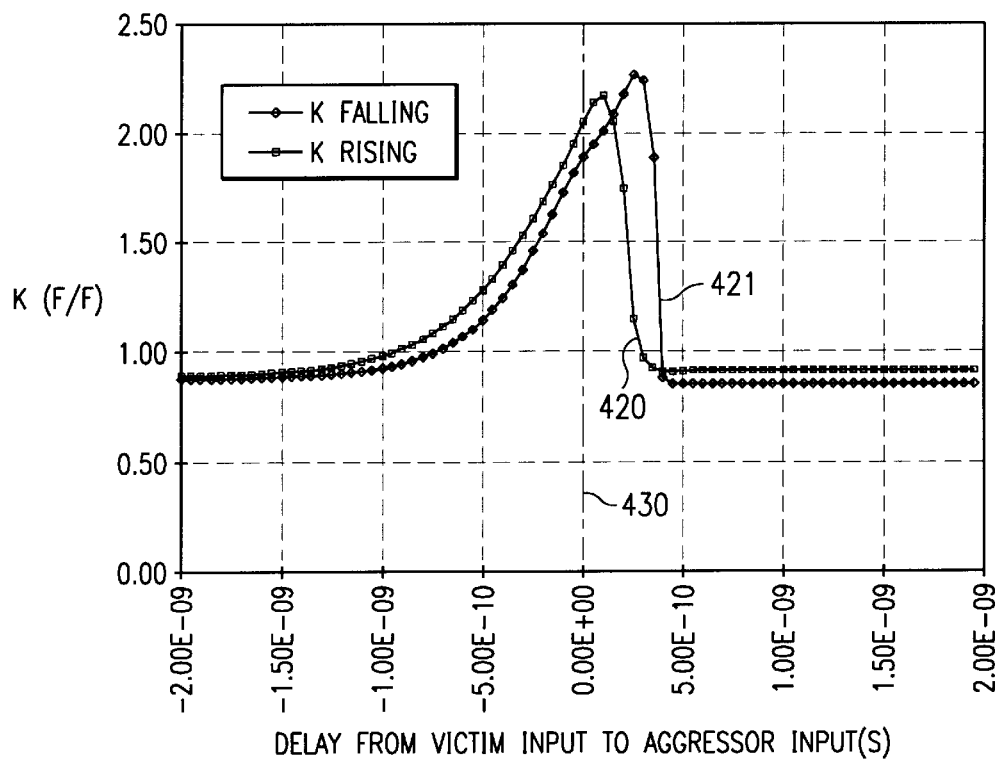
FIG. 7B is a plot of coupling coefficients for the plot of FIG. 7A, according to an aspect of the present invention.

FIG. 7B is a plot of coupling coefficient K of the plot of FIG. 7A, according to an aspect of the present invention. As described earlier, coefficient K is calculated based on a difference in propagation delay time 240 from a coupled load simulation and propagation 120 from an uncoupled load simulation and the effective resistance driving capacitors 204a–n. Also, as described earlier, a different value of K is calculated for rising signals and for falling signals. Plot line 420 is a plot of K for a rising signal on net 203 of a simulation model 300. On both plots, K is maximum when the victim signal and the aggressor signals transition at approximately the same time. For a worst case analysis, the largest value of K from either plot line 420 or 421 is selected for use in uncoupled simulation model 300. Thus, a K value of approximately 2.3 would be selected.

Figure 8A:
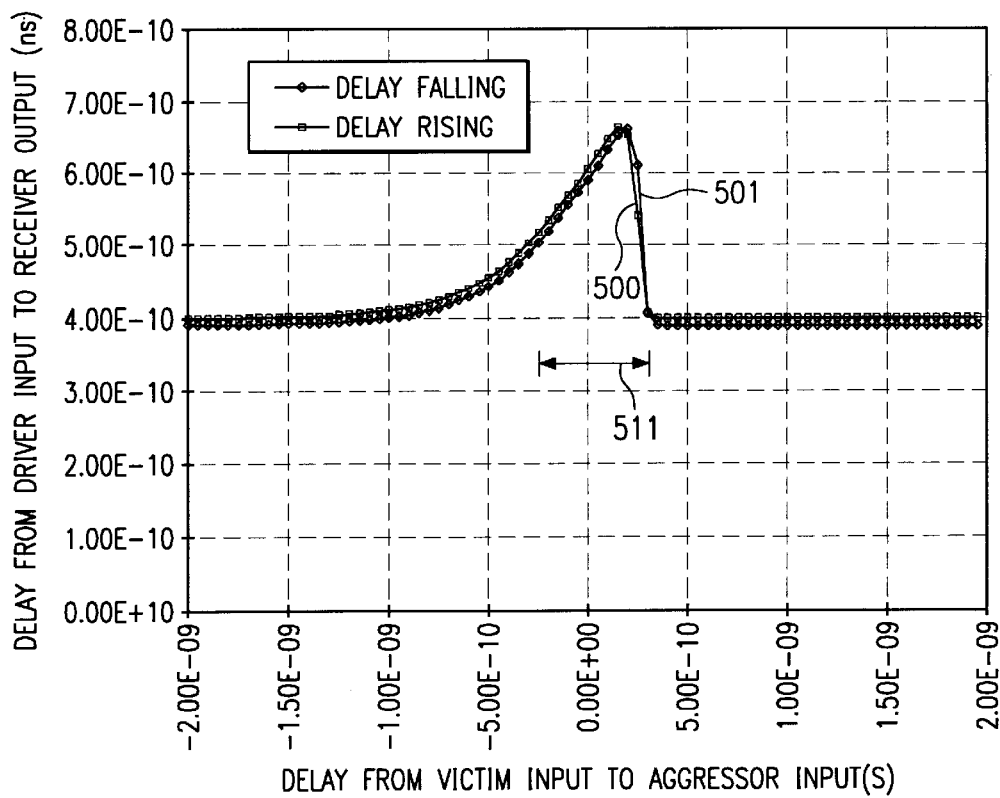
FIG. 8A is a plot of propagation delay verses relative switching time of the outside signals in a simulation model similar to that of FIG. 4, where the P:N ratio of the buffer is 2.5:1 and aggressor signals are switching in the opposite direction.

FIG. 8A is a plot of propagation delay verses relative switching time of the outside signals in a simulation model similar to that of FIG. 4, where the P:N ratio of the buffer 201 is 2.5:1. Because of the differences in the pull-up and pull-down drivers, total propagation time shown by plot 500 for a rising signal and plot 501 for a falling signal is somewhat different from FIG. 7A and the amount of variation is somewhat different. However, there is still a significant difference in propagation delay over a range of about 0.5 ns, as indicated by window of sensitivity 511.

Figure 8B:
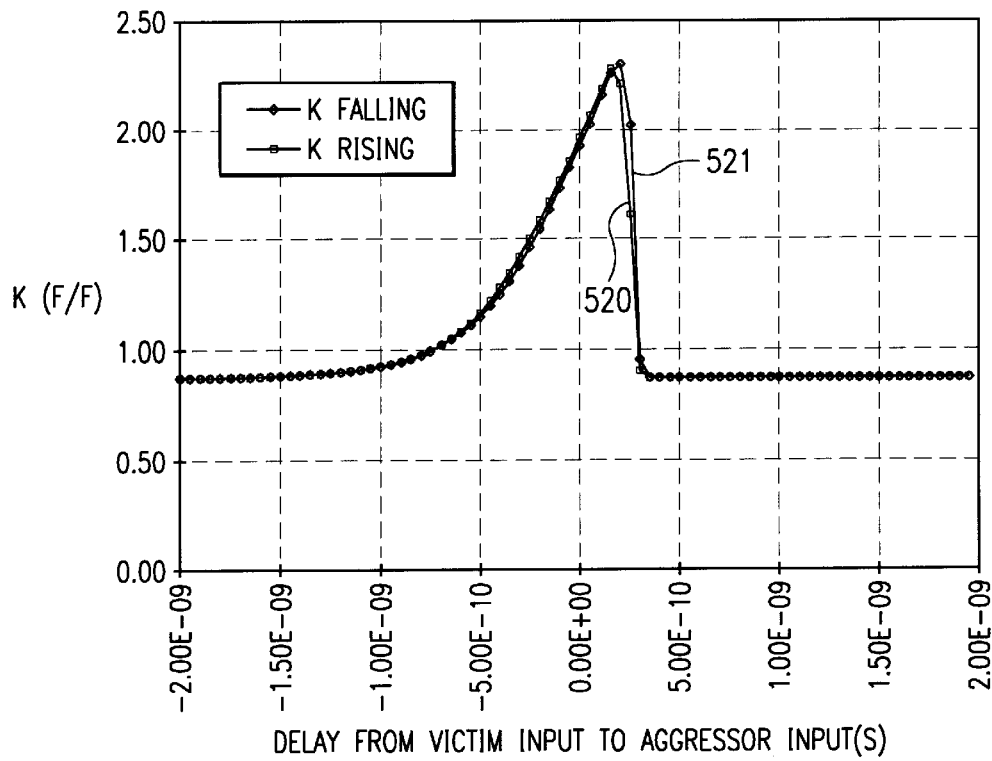
FIG. 8B is a plot of coupling coefficients of the plot of FIG. 8A with aggressor signals are switching in the opposite direction, according to an aspect of the present invention.

FIG. 8B is a plot of coupling coefficients for the plot of FIG. 8A, according to an aspect of the present invention. Due to the differences in propagation delay from FIG. 7A and the difference in output resistance of the modified pull-up driver and pull-down driver, the plots of FIG. 8B are different from the plots of FIG. 7B. Plot line 520 for a rising signal has a maximum value of K of about 2.4. Plot 521 for a falling signal also has a maximum value of K of about 2.4. Therefore, a K value of 2.4 is used in a simulation model 300 with buffer 201 modified as described above for worst case timing analysis.

Figure 9A:
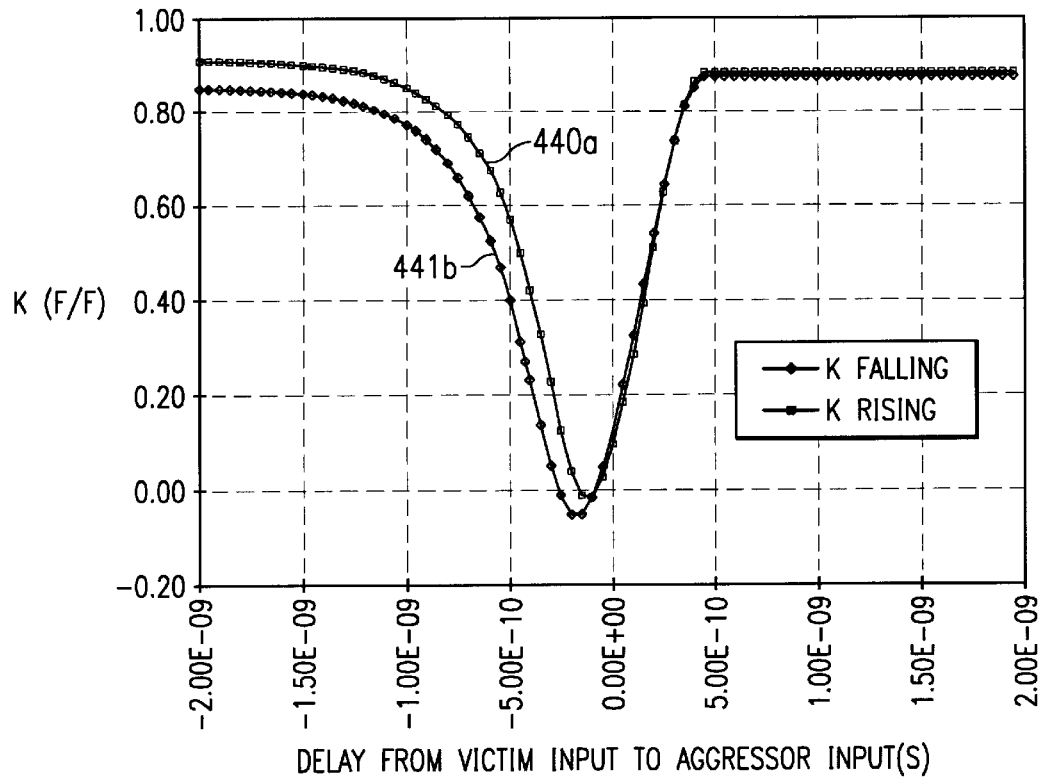
FIG. 9A is a plot of coupling coefficients for the plot of FIG. 7A where the aggressor signals transition in the same direction as the victim and the P:N ratio of the buffer is 1.3:1, according to an aspect of the present invention.

FIG. 9A is a plot of coupling coefficients K for the plot of FIG. 7A where the aggressor signals transition in the same direction as the victim signal. It has now been determined that when a signal on the aggressor net transitions in the same direction as a signal on the victim net, the propagation delay of the signal on the victim nets is significantly decreased. In order to model such a decrease in propagation delay, simulation model 300 can be used with a reduced or negative, value of K, according to an aspect of the present invention. Plot line 440a for a rising signal on the victim nets has a minimum value of approximately −0.08, while plot line 441a for a falling signal on the victim nets has a minimum value of approximately −0.05. For a worst case analysis, the smallest value of K from either plot line 440a or 441a is selected for use in decoupled simulation model 300. Thus, a K value of approximately −0.1 would be selected. According to an aspect of the present invention, this decrease in propagation delay 240 by signal coupling from aggressor nets is included in a worst case timing analysis of a circuit during design of an integrated circuit, and a trial circuit design or trail layout of the circuit is modified if the decreased propagation delay 240 is less than an allowable propagation delay time value for the circuit.

Figure 9B:
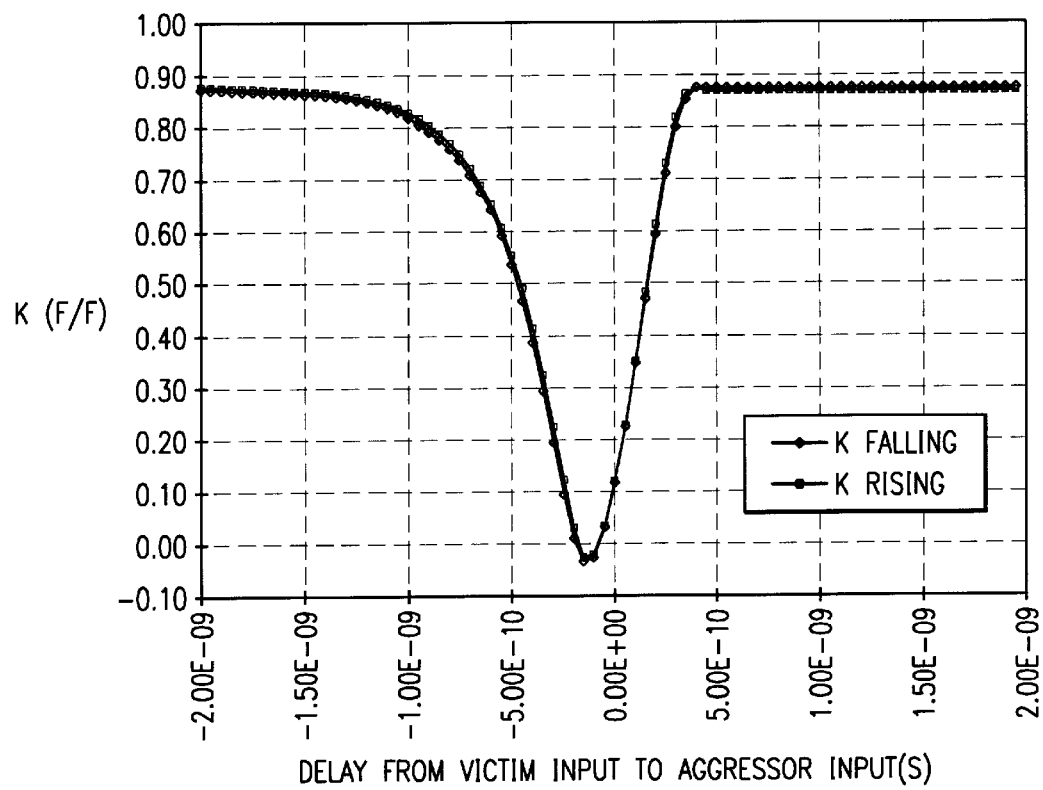
FIG. 9B is a plot of coupling coefficients for the plot of FIG. 7A where the aggressor signals transition in the same direction as the victim signal and the SECOND COEFFICIENT K ratio of the buffer is 2.5:1, according to an aspect of the present invention.

FIG. 9B is a plot of coupling coefficients K for the plot of FIG. 8A where the aggressor signals transition in the same direction as the victim signal. Of note, the values for rising and falling coupling coefficient K are now approximately equal This is due to the different P:N ratio when compared to plot 7A. The P:N ratio of 2.5 gives the pull-up and pull-down drivers approximately the same drive strength and thus the buffer now behaves symmetric with respect to rising and falling values of K.

As can be seen by examining FIGS. 7B, 8B, 9A and 9B, various values of K will be determined for different types of buffers, different signal switching directions, and various signal line coupling capacitance and capacitance to ground due to signal line width and insulation layer thickness. For a large integrated circuit with many types of buffer circuits and signal line configurations, an expedient is to evaluate a variety of buffer and signal line configurations to form a set of K(i) coefficients, and then select an combined value for K to be used for all the circuit simulation models of victim nets in the integrated circuit which have a potential for being affected by aggressor nets. A combined value for K can be determined by averaging the set of K(i), or selecting an extreme value from the set, for example.

A victim net is identified by determining if a signal on an adjacent signal line transitions within a window of sensitivity of a signal transition on the subject net.

In another embodiment of the present invention, a table or equivalent means for cataloging a variety of coefficient values is created based on an analysis of each type of buffer in combination with each type of signal line configuration that may be driven by a respective type of buffer. Then, each circuit net within the entire integrated circuit design that is potentially a victim net due to adjacent signal lines which have signals that transition within a window of sensitivity is defined. A value for K is then selected from the table that corresponds to the buffer type and the signal line configuration of that victim net. A decoupled simulation of the entire integrated circuit is then performed using the various values of K selected from the table.

In another embodiment of the present invention, more than two aggressor signal lines can be considered with respect to a victim signal. For example, four aggressor signals may be considered. One example would be with two aggressor signal lines on each side of the victim signal. Another example would be with aggressor signal lines on each side of a victim signal line in the same plane, and additional aggressor signal lines considered in signal routing planes above or below the routing plane of the victim signal.

In another embodiment, effects of different sets of aggressor signals on a same victim signal can be considered. For example, along the length of a victim signal, different aggressor signals may be routed in proximity to the victim signal.

Figure 10:
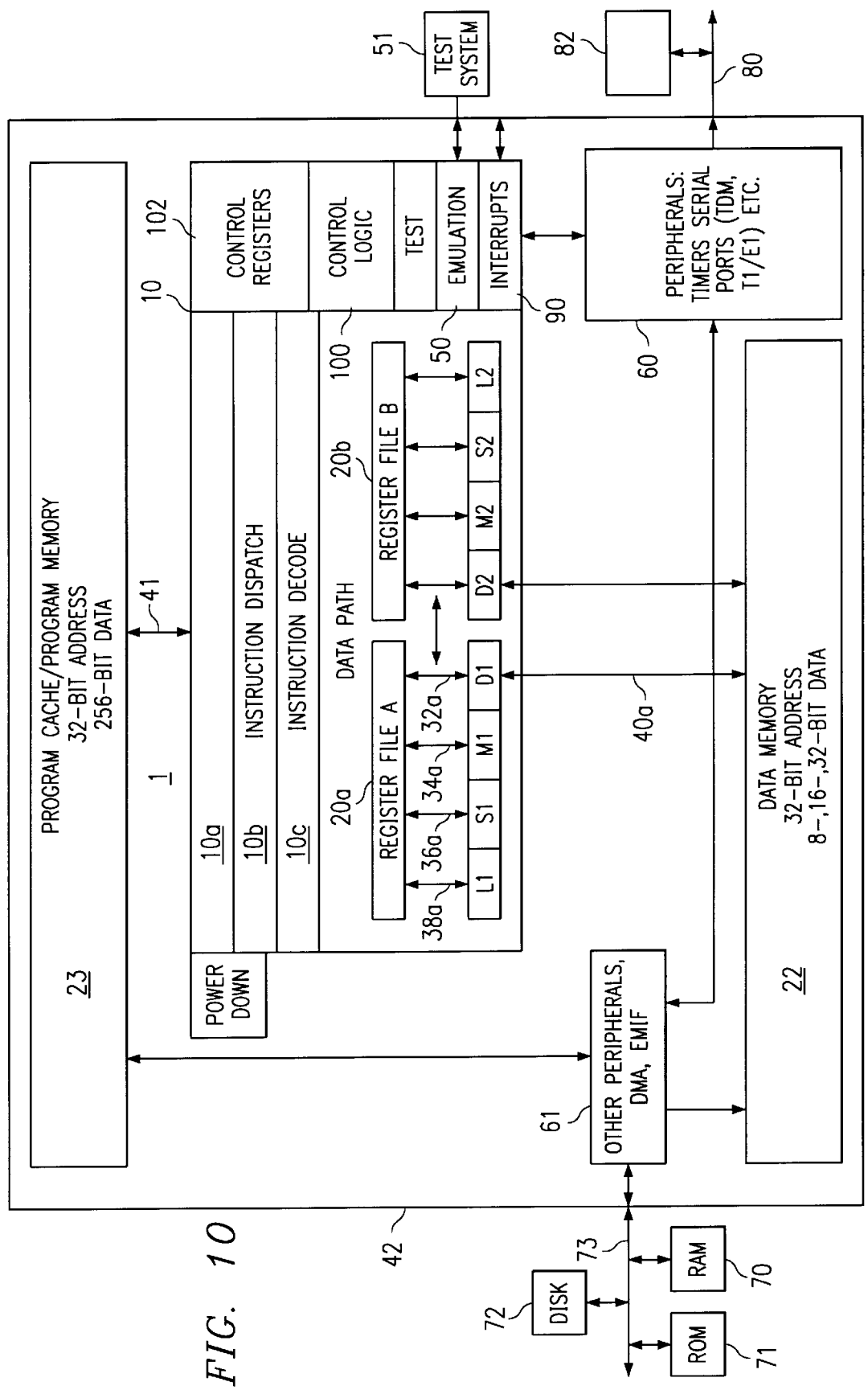
FIG. 10 is a block diagram of an integrated circuit which is designed and fabricated according to aspects of the present invention.

FIG. 10 is a block diagram of a microprocessor 1, which has an embodiment of the present invention. Microprocessor 1 is a VLIW digital signal processor ("DSP"). In the interest of clarity, FIG. 1 only shows those portions of microprocessor 1 that are relevant to an understanding of an embodiment of the present invention. Details of general construction for DSPs are well known, and may be found readily elsewhere For example, U.S. Pat. No. 5,072,418 issued to Frederick Boutaud, et al, describes a DSP in detail and is incorporated herein by reference. U.S. Pat. No. 5,329,471 issued to Gary Swoboda, et al, describes in detail how to test and emulate a DSP and is incorporated herein by reference. Details of portions of microprocessor 1 relevant to an embodiment of the present invention are explained in sufficient detail hereinbelow, so as to enable one of ordinary skill in the microprocessor art to make and use the invention.

In microprocessor 1 there are shown a central processing unit (CPU) 10, data memory 22, program memory 23, peripherals 60 and an external memory interface (EMIF) with a direct memory access (DMA) 61. CPU 10 further has an instruction fetch/decode unit 10a–c, a plurality of execution units, including an arithmetic and load/store unit D1, a multiplier M1, an ALU/shifter unit S1, an arithmetic logic unit ("ALU") L1, a shared multiport register file 20a from which data are read and to which data are written. Decoded instructions are provided from the instruction fetch/decode unit 10a–c to the functional units D1, M1, S1, and L1 over various sets of control lines which are not shown. Data are provided to/from the register file 20a from/to to load/store units D1 over a first set of busses 32a, to multiplier M1 over a second set of busses 34a, to ALU/shifter unit S1 over a third set of busses 36a and to ALU L1 over a fourth set of busses 38a. Data are provided to/from the memory 22 from/to the load/store units D1 via a fifth set of busses 40a. Note that the entire data path described above is duplicated with register file 20b and execution units D2, M2, S2, and L2. Instructions are fetched by fetch unit 10a from instruction memory 23 over a set of busses 41. Emulation unit 50 provides access to the internal operation of integrated circuit 1 which can be controlled by an external test system 51.

Note that the memory 22 and memory 23 are shown in FIG. 11 to be a part of a microprocessor 1 integrated circuit, the extent of which is represented by the box 42. The memories 22–23 could just as well be external to the microprocessor 1 integrated circuit 42, or part of it could reside on the integrated circuit 42 and part of it be external to the integrated circuit 42. Also, an alternate number of execution units can be used.

When microprocessor 1 is incorporated in a data processing system, additional memory or peripherals may be connected to microprocessor 1, as illustrated in FIG. 11. For example, Random Access Memory (RAM) 70, a Read Only Memory (ROM) 71 and a Disk 72 are shown connected via an external bus 73. Bus 73 is connected to the External Memory Interface (EMIF) which is part of functional block 61 within microprocessor 42. A Direct Memory Access (DMA) controller is also included within block 61. The DMA controller is generally used to move data between memory and peripherals within microprocessor 1 and memory and peripherals which are external to microprocessor 1.

Several example systems which can benefit from aspects of the present invention are described in U.S. Pat. No. 5,072,418, which was incorporated by reference herein, particularly with reference to FIGS. 2–18 of U.S. Pat. No. 5,072,418. A microprocessor incorporating an aspect of the present invention to improve performance or reduce cost can be used to further improve the systems described in U.S. Pat. No. 5,072,418. Such systems include, but are not limited to, industrial process controls, automotive vehicle systems, motor controls, robotic control systems, satellite telecommunication systems, echo canceling systems, modems, video imaging systems, speech recognition systems, vocoder-modem systems with encryption, and such.

A description of various architectural features of the microprocessor of FIG. 1 is provided in co-assigned application Ser. No. 09/012,813 which is included herein by reference. A description of a complete set of instructions for the microprocessor of FIG. 1 is also provided in co-assigned application Ser. No. 09/012,813.

Fabrication of data processing device 1 involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

An alternative embodiment of the novel aspects of the present invention may include other circuitries which are combined with the circuitries disclosed herein in order to reduce the total gate count of the combined functions. Since those skilled in the art are aware of techniques for gate minimization, the details of such an embodiment will not be described herein.

An advantage of the present invention is that a victim net can be identified by evaluation a circuit nets to determine it a signal on an adjacent signal line transitions within a window of sensitivity of a signal transition on the net being evaluated.

Another advantage of the present invention is that a worst case propagation delay timing analysis for a signal net can be performed using a decoupled simulation model that is modified by a coefficient K. The results of such an analysis have approximately the same accuracy as a coupled simulation model would provide. Another advantage of the present invention is that an average value can be used for K for a set of various types of buffer circuits and signal line configurations.

Another advantage of the present invention is that both an increase in propagation delay time and a decrease in propagation delay time can be accurately analyzed using a simple decoupled simulation model.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of fabricating an integrated circuit which contains a first plurality of signal lines in close proximity, such that capacitive coupling among the signal lines is operable to affect a delay time of a signal on a victim signal line of the first plurality of signal lines, the method comprising the steps of;

creating a trial layout for the plurality of signal lines;

assigning a coupling capacitance parameter to the victim signal line representative of a coupling capacitance between the victim signal line and an aggressor signal line from the first plurality of signal lines;

compensating for a variation in delay time of the signal on the victim signal line due to simultaneous switching of a signal on the aggressor signal line by modifying the coupling capacitance parameter;

simulating the operation of the trial layout using the modified coupling capacitance parameter to determine a total propagation delay time for the signal on the victim signal line;

modifying the trial layout if the total propagation delay time for the signal on the victim signal line is not an allowable propagation delay time value; and fabricating the integrated circuit according to the modified trial layout.

2. A method of designing an integrated circuit which contains a first plurality of signal lines in close proximity, such that capacitive coupling among the signal lines is operable to affect a propagation delay time of a signal on a victim signal line of the first plurality of signal lines, the method comprising the steps of:

creating a trial layout for the plurality of signal lines;

assigning a coupling capacitance parameter to the victim signal line representative of a coupling capacitance between the victim signal line and a nearest aggressor signal line from the first plurality of signal lines;

compensating for additional propagation delay time of the signal on the victim signal line due to simultaneous switching of a signal on the nearest aggressor signal line by modifying the coupling capacitance parameter;

simulating the operation of the trial layout using the modified coupling capacitance parameter to determine a total propagation delay time for the signal on the victim signal line; and modifying the trial layout if the total propagation delay time for the signal on the victim signal line is not an allowable propagation delay time value.

3. The method of claim 2, wherein each signal line of the first plurality of signal lines is driven by a buffer of a first type, the method further comprising:

determining a first coefficient K that is related to an effective resistance of the first type buffer; and wherein the step of compensating further comprises modifying the coupling capacitance parameter by multiplying it by the first coefficient K.

4. The method of claim 2, wherein the step of determining a coefficient further comprises:

creating a representative layout of the victim signal line and a first aggressor signal line and a second aggressor signal line, wherein the three signal lines are driven by a first set of drivers;

determining a match propagation delay time of the victim signal in response to simultaneous switching of a signal on the first and second aggressor signal lines by simulating the operation of the representative layout using a coupled simulation; and selecting first coefficient K such that a decoupled simulation of the victim signal in the representative layout produces approximately a same total propagation delay time as the match propagation delay time determined using the coupled simulation.

5. The method of claim 4, wherein the step of simulating the operation of the trial layout is performed with a decoupled load simulation.

6. The method of claim 5, wherein the integrated circuit contains a second victim signal included in a second plurality of signal lines in close proximity, wherein the second plurality of signal lines is driven respectively by a second set of buffers, further comprising:

assigning a second coupling capacitance parameter to the second victim signal line representative of a coupling capacitance between the second victim signal line and an aggressor signal line from the second plurality of signal lines; selecting a second coefficient K that is related to an effective resistance of the second set of buffers; and compensating for additional propagation delay time of a signal on the second victim signal line due to simultaneous switching of a signal on an aggressor signal line in the second plurality of signal lines by modifying the second coupling capacitance parameter by multiplying it by the second coefficient K.

7. The method of claim 5, wherein the step of modifying the trial layout comprises replacing the driver driving each signal of the first plurality of signal lines with a driver of a third type.

8. The method of claim 5, wherein the step of modifying the trial layout comprises modifying a physical parameter of the first plurality of signal lines so that a different capacitive coupling among the signal lines is produced.

9. The method of claim 4, wherein the step of selecting first coefficient K further comprises:

determining an unmodified propagation delay time by simulating the operation of the victim net without regard to signal coupling from the aggressor nets;

determining a value for an effective drive resistance with the first type driver; and calculating first coefficient K with an equation of the form:

K=1+(match propagation delay−unmodified propagation delay)/(2*R*Ccoup);

where R is the effective drive resistance with the first type driver and Ccoup is the coupling capacitance parameter.

10. The method of claim 9, wherein the step of selecting first coefficient K further comprises:

calculating a plurality of coefficients relating to a plurality of buffer types; and combining the plurality of coefficients to form a single coefficient value.

11. The method of claim 4, wherein the step of compensating for additional propagation delay time is performed only if a signal on the aggressor signal lines transition within a window of sensitivity of a signal transition on the victim line.

12. The method of claim 10, wherein the window of sensitivity is a time period that is proportional to the transition rate of the victim line.

13. The method of claim 4, wherein the first coefficient K is calculated as a function of the relative transition rates and time of the victim signal and the aggressor signals.

14. The method of claim 4, wherein the first coefficient K is calculated as a function factors selected from a group consisting of:

a transition rate of the victim signal;

a transition rate of an aggressor signal;

a drive strength of a victim driver;

a drive strength of an aggressor driver, a relative switching time between a victim signal and an aggressor signal;

a relative switching direction between a victim signal and an aggressor signal: and an analysis of the location of the coupling on the victim and aggressor signals.

15. The method of claim 2, wherein the step of modifying the trial layout is performed if the total propagation delay time is less than the allowable propagation delay time value.

16. The method of claim 2, wherein the step of modifying the trial layout is performed if the total propagation delay time not within a range of allowable propagation delay time values.

17. A computer system, comprising:

a processor for processing instructions;

a memory circuit for holding instructions connected to the processor;

a mass storage device for holding a design program operable to transfer the design program to the memory circuit;

wherein the design program on the mass storage device comprises instructions for designing an integrated circuit which contains a first plurality of signal lines in close proximity, such that capacitive coupling among the signal lines is operable to affect a propagation delay time of a signal on a victim signal line of the first plurality of signal lines, the instructions comprising the steps of:

creating a trial layout for the plurality of signal lines;

assigning a coupling capacitance parameter to the victim signal line representative of a coupling capacitance between the victim signal line and a nearest aggressor signal line from the first plurality of signal lines;

compensating for additional propagation delay time of the signal on the victim signal line due to simultaneous switching of a signal on the nearest aggressor signal line by modifying the coupling capacitance parameter;

simulating the operation of the trial layout using the modified coupling capacitance parameter to determine a total propagation delay time for the signal on the victim signal line; and modifying the trial layout if the total propagation delay time for the signal on the victim signal line is not an allowable propagation delay time value.

18. A mass storage device for holding a computer program, wherein a design program stored on the mass storage device comprises instructions for designing an integrated circuit which contains a first plurality of signal lines in close proximity, such that capacitive coupling among the signal lines is operable to affect a propagation delay time of a signal on a victim signal line of the first plurality of signal lines, the design program comprising the steps of:

creating a trial layout for the plurality of signal lines;

assigning a coupling capacitance parameter to the victim signal line representative of a coupling capacitance between the victim signal line and a nearest aggressor signal line from the first plurality of signal lines;

compensating for additional propagation delay time of the signal on the victim signal line due to simultaneous switching of a signal on the nearest aggressor signal line by modifying the coupling capacitance parameter;

simulating the operation of the trial layout using the modified coupling capacitance parameter to determine a total propagation delay time for the signal on the victim signal line; and modifying the trial layout if the total propagation delay time for the signal on the victim signal line is not an allowable propagation delay time value.

19. The mass storage device of claim 18, wherein the mass storage device is a diskette.

* * * * *